United States Patent
Yoneda

(10) Patent No.: US 9,380,872 B2
(45) Date of Patent: Jul. 5, 2016

(54) SLIDE RAIL UNIT

(71) Applicant: NEC Corporation, Minato-ku, Tokyo (JP)

(72) Inventor: Noriyoshi Yoneda, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/606,154

(22) Filed: Jan. 27, 2015

(65) Prior Publication Data

US 2015/0208802 A1    Jul. 30, 2015

(30) Foreign Application Priority Data

Jan. 29, 2014   (JP) .................. 2014-014518

(51) Int. Cl.
| | |
|---|---|
| *A47B 95/00* | (2006.01) |
| *A47B 88/04* | (2006.01) |
| *A47B 88/12* | (2006.01) |
| *A47B 88/16* | (2006.01) |
| *A47B 88/10* | (2006.01) |
| *H05K 7/14* | (2006.01) |

(52) U.S. Cl.
CPC .............. *A47B 88/04* (2013.01); *A47B 88/10* (2013.01); *A47B 88/12* (2013.01); *A47B 88/16* (2013.01); *H05K 7/1489* (2013.01); *A47B 2088/0444* (2013.01); *A47B 2210/0059* (2013.01)

(58) Field of Classification Search
CPC .................................................. A47B 88/047
USPC ................................ 312/333, 334.44, 334.46
See application file for complete search history.

(56) References Cited

U.S. PATENT DOCUMENTS

| | | | | |
|---|---|---|---|---|
| 3,650,578 | A * | 3/1972 | Del Vecchio ........... | A47B 88/10 312/334.46 |
| 5,085,523 | A * | 2/1992 | Hobbs ..................... | A47B 88/16 384/18 |
| 6,655,763 | B2 * | 12/2003 | Judge ...................... | A47B 88/10 312/334.11 |
| 6,796,625 | B2 * | 9/2004 | Lauchner ............. | H05K 5/0013 312/333 |
| 8,528,999 | B2 * | 9/2013 | Chen ....................... | A47B 88/14 312/333 |
| 2004/0080245 | A1 * | 4/2004 | Lammens ............... | A47B 88/08 312/333 |
| 2005/0017613 | A1 * | 1/2005 | Cirocco ................. | A47B 88/10 312/333 |
| 2005/0088069 | A1 * | 4/2005 | Greenwald ............ | A47B 88/08 312/333 |
| 2006/0163983 | A1 * | 7/2006 | Wu ........................ | A47B 88/10 312/333 |
| 2012/0153792 | A1 * | 6/2012 | Yu .......................... | F16C 29/005 312/333 |

FOREIGN PATENT DOCUMENTS

| | | |
|---|---|---|
| JP | 2011092259 A | 5/2011 |
| JP | 3174031 U | 3/2012 |

* cited by examiner

*Primary Examiner* — Matthew Ing

(57) ABSTRACT

The slide rail unit according to an exemplary of the invention includes an outer rail attachable to a rack, a middle rail slidably supported by the outer rail along the extending direction of the outer rail, and an inner rail slidably supported by the middle rail along the extending direction of the middle rail. The inner rail includes a lock mechanism. The lock mechanism includes a release member which releases a press against the middle rail by the inner rail when the inner rail slides in one direction along the extending direction of the middle rail, and a suppression member which prevents the middle rail from sliding in the one direction.

7 Claims, 15 Drawing Sheets

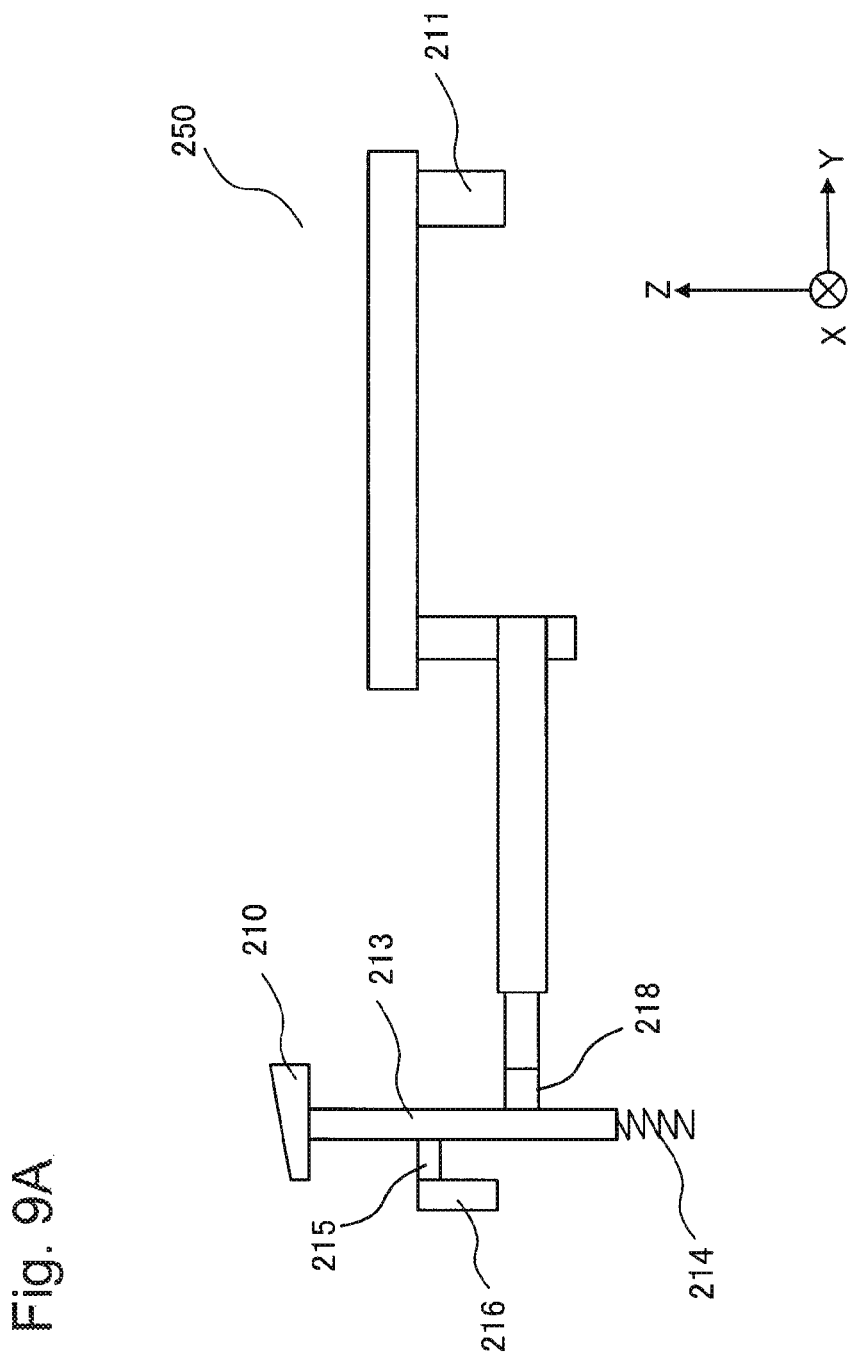

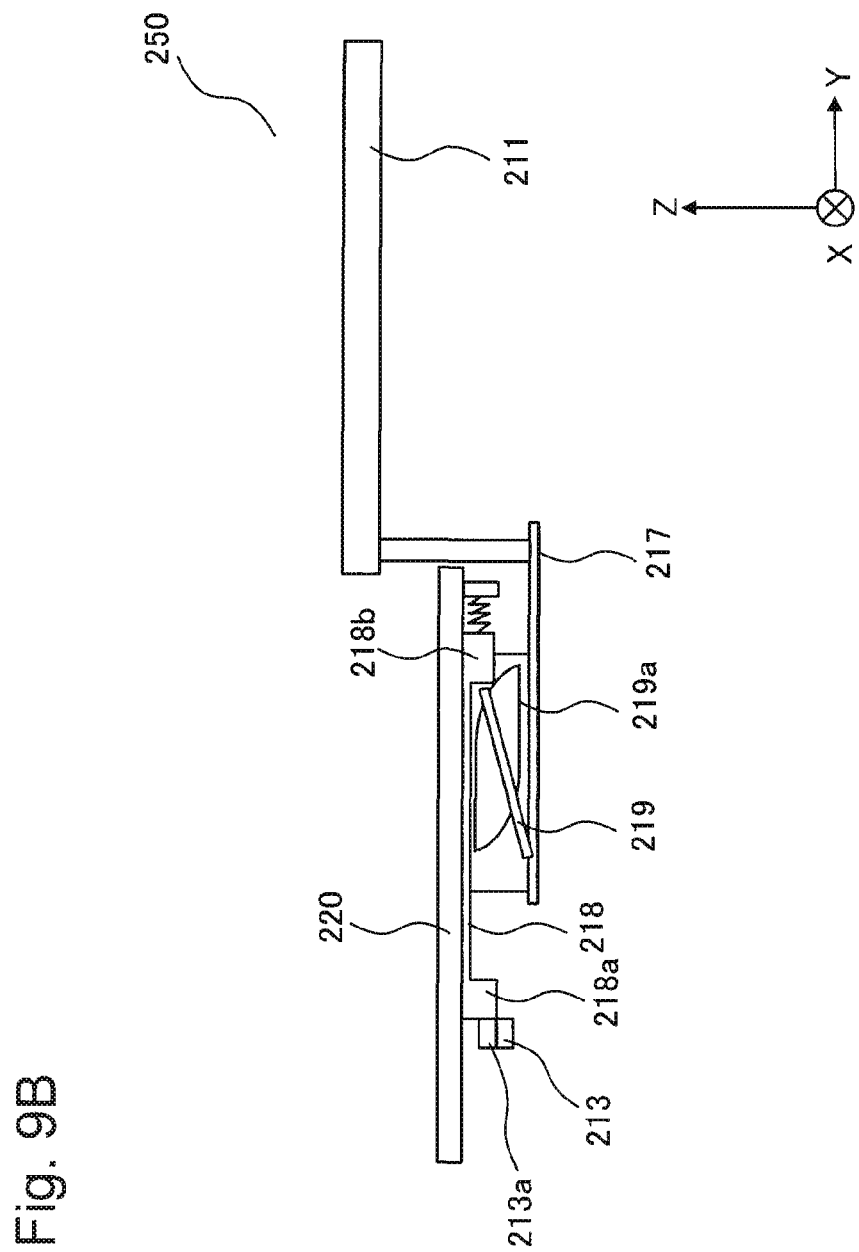

SLIDE RAIL UNIT

This application is based upon and claims the benefit of priority from Japanese Patent Application No. 2014-014518, filed on Jan. 29, 2014, the disclosure of which is incorporated herein in its entirety by reference.

TECHNICAL FIELD

The present invention relates to a three-member slide rail unit or the like, the three-member slide rail unit including an inner rail, a middle rail, and an outer rail.

BACKGROUND ART

There is an electronic apparatus which is placed in a rack (cabinet) using a three-member slide rail unit. The three-member slide rail unit usually includes an outer rail which is fixed on the cabinet, a middle rail which is drawably supported by the outer rail, and an inner rail which is drawably supported by the middle rail. The electronic apparatus is usually fixed on the inner rail.

When replacing such electronic apparatuses, a user removes an electronic apparatus by drawing out each rail which constitutes a slide rail unit.

FIG. 14 is a drawing of a related art illustrating a state in which an electronic apparatus as mentioned above is removed together with an inner rail. As illustrated in FIG. 14, an electronic apparatus 10 is fixed on an inner rail 23. The inner rail 23 is drawably supported by a middle rail 22. The middle rail 22 is drawably supported by an outer rail 21, the outer rail 21 being fixed on a cabinet which is not illustrated.

FIG. 15 is a drawing of another related art illustrating a state in which an electronic apparatus 10 which is fixed on an inner rail 23 is drawn out and lifted up to be removed from the inner rail 23.

For smooth sliding, the slide rail unit illustrated in FIG. 14 has a structure in which the inner rail 23 is drawn out from the middle rail 22 after the middle rail 22 has been completely extended. Therefore, when the electronic apparatus 10 is removed from the cabinet, the inner rail 23 is required to be drawn out after the middle rail 22 has been fully drawn out. This requires a large workspace in front of the cabinet, which restricts a place for the cabinet to be installed.

Although the slide rail unit as illustrated in FIG. 15 does not require a large workspace in front of the cabinet, the electronic apparatus 10 is required to be lifted up to a high position, which is a burden to a user. When an electronic apparatus 10 is mounted again after an electronic apparatus is removed, the electronic apparatus 10 has to be mounted onto the extended inner rail 23. At this time, mounting of the electronic apparatus 10 is not easy since the inner rail 23 is subject to sway.

For example, Japanese Utility Model No. 3174031 discloses a slide rail assembly in which an engaging lock between an inner rail and a middle rail can be released, the inner rail is drawn out continuously, and a synchronizing mechanism between the middle rail and the inner rail and a positioning mechanism between the middle rail and an outer rail are connected with each other.

Japanese Unexamined Patent Application Publication No. 2011-092259 discloses a slide rail unit which can reduce a workspace required for removing a moving rail from a middle rail and which can enhance the stability of a rack.

As mentioned above, when an electronic apparatus is mounted in a cabinet using a three-member slide rail, there is a problem that a place for the cabinet to be installed is restricted since a large workspace which is required in front of the cabinet for taking out the electronic apparatus from the slide rail is required to be secured.

In the above-mentioned Japanese Utility Model No. 3174031, a large number of members having a complicated shape are required, which makes the design and manufacture thereof complicated. In the slide rail unit disclosed in the above-mentioned Japanese Unexamined Patent Application Publication No. 2011-092259, a member which prevents a middle rail from being drawn out is required to be attached to a cabinet, which takes time for installation.

SUMMARY

The present invention has been made in view of the above-mentioned problems, and a primary object of the present invention is to provide a slide rail unit which, when an object is mounted on a rack by using the slide rail unit, can reduce a workspace required for taking out the object from the slide rail unit.

A slide rail unit according to a first aspect of the present invention includes an outer rail attachable to a rack, a middle rail slidably supported by the outer rail along an extending direction of the outer rail, and an inner rail slidably supported by the middle rail along an extending direction of the middle rail. The inner rail includes a lock mechanism including: a release member which releases a press against the middle rail by the inner rail when the inner rail slides in one direction along the extending direction of the middle rail; and a suppression member which prevents the middle rail from sliding in the one direction.

A rack according to a first aspect of the present invention includes a slide rail unit, wherein the slide rail unit includes an outer rail attachable to a rack, a middle rail slidably supported by the outer rail along the extending direction of the outer rail, and an inner rail slidably supported by the middle rail along the extending direction of the middle rail, and the inner rail includes a lock mechanism including: a release member which releases a press against the middle rail by the inner rail when the inner rail slides in one direction along the extending direction of the middle rail; and a suppression member which prevents the middle rail from sliding in the one direction.

According to the present invention, the advantageous effect is that, when an object is mounted on a rack by using the slide rail unit, a workspace required for taking out the object from the slide rail unit can be reduced.

BRIEF DESCRIPTION OF THE DRAWINGS

Exemplary features and advantages of the present invention will become apparent from the following detailed description when taken with the accompanying drawings in which:

FIG. 9A is a side view of the lock adjustment mechanism which the slide rail unit according to the first exemplary embodiment of the present invention includes.

FIG. 9B is a top view of the lock adjustment mechanism which the slide rail unit according to the first exemplary embodiment of the present invention includes.

EXEMPLARY EMBODIMENT

Exemplary embodiments of the present invention will now be described in detail with reference to the Drawings.

First Exemplary Embodiment

Figure 1:
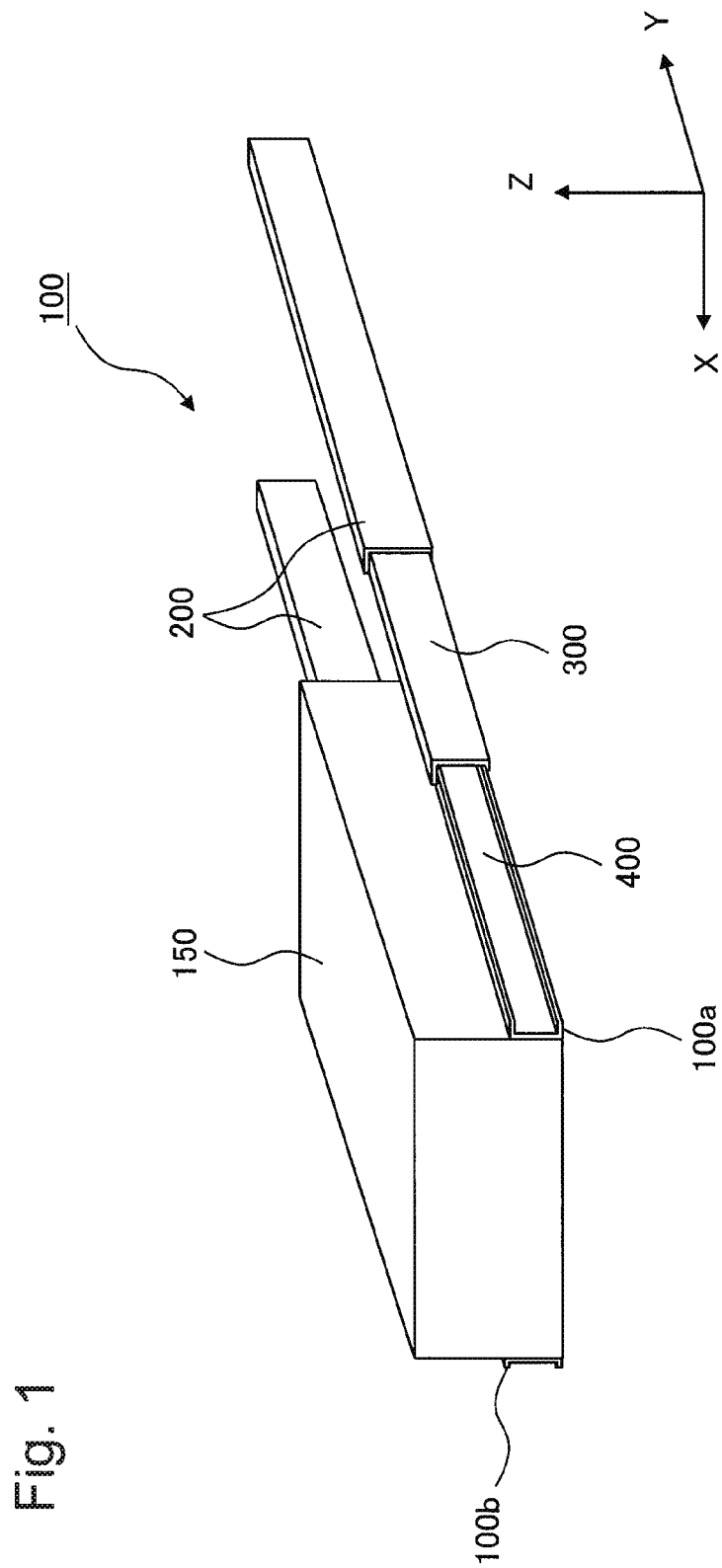
FIG. 1 is a perspective view illustrating a state in which a slide rail unit according to a first exemplary embodiment of the present invention is drawn out.

FIG. 1 is a perspective view illustrating a state in which a three-member slide rail unit 100 according to a first exemplary embodiment of the present invention is drawn out. In the description below, it is assumed that the slide rail unit 100 be arranged in a three dimensional space (X-Y-Z coordinate space) as illustrated in FIG. 1.

As illustrated in FIG. 1, the slide rail unit 100 includes a pair of rail sets 100a, 100b. Each rail set 100a, 100b has an inner rail 400, a middle rail 300, and an outer rail 200. The outer rail 200 is fixed on a cabinet (rack) which is not illustrated. The middle rail 300 is slidably supported by the outer rail 200 along the extending direction (Y direction and (−Y) direction) of the outer rail 200. Similarly, the inner rail 400 is slidably supported by the middle rail 300 along the extending direction of the middle rail 300. An electronic apparatus 150 is held by the inner rail 400. In the present exemplary embodiment, the slide rail unit 100 which holds the electronic apparatus 150 as an object will be described. In the following description, the (−Y) direction may be referred to as the front or one direction, and the Y direction may be referred to as the back or the other direction; movement in the (−Y) direction may be referred to as a forward movement, and movement in the Y direction may be referred to as a backward movement.

Figure 2:
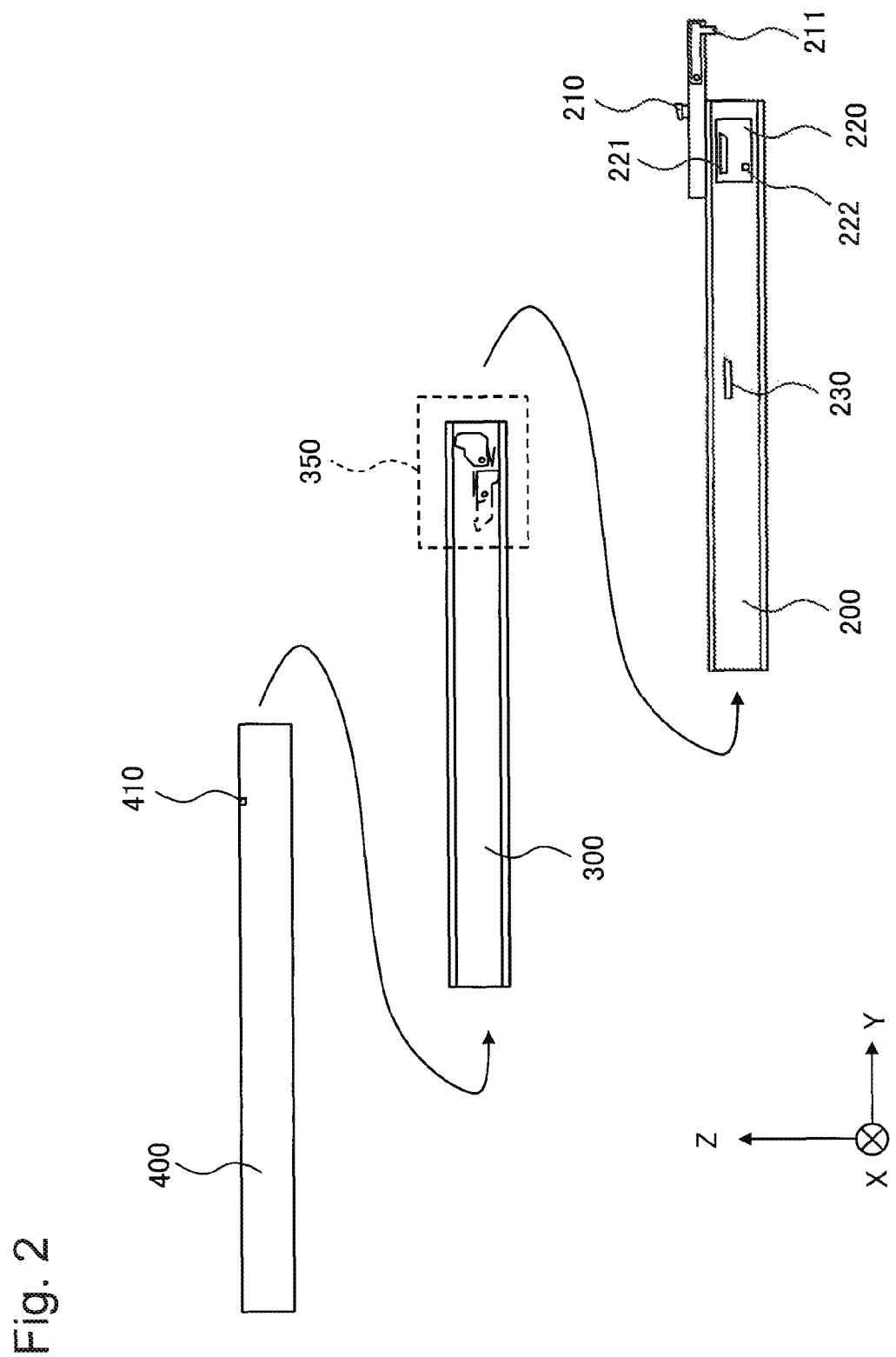
FIG. 2 is a side view illustrating a rail set of the slide rail unit according to the first exemplary embodiment of the present invention in a state in which each rail is drawn out.

FIG. 2 is a side view of the rail set 100b in the rear side of the cabinet (not illustrated) in the X-axis direction shown FIG. 1 in the state in which each rails in the rail set 100b being drawn out. The arrows mean that the inner rail 400 is accommodated in the middle rail 300 and the middle rail 300 is accommodated in the outer rail 200. FIG. 1 omits illustration of components which are configured on each of the inner rail 400, the middle rail 300, and the outer rail 200 shown in FIG. 2.

Figure 3:
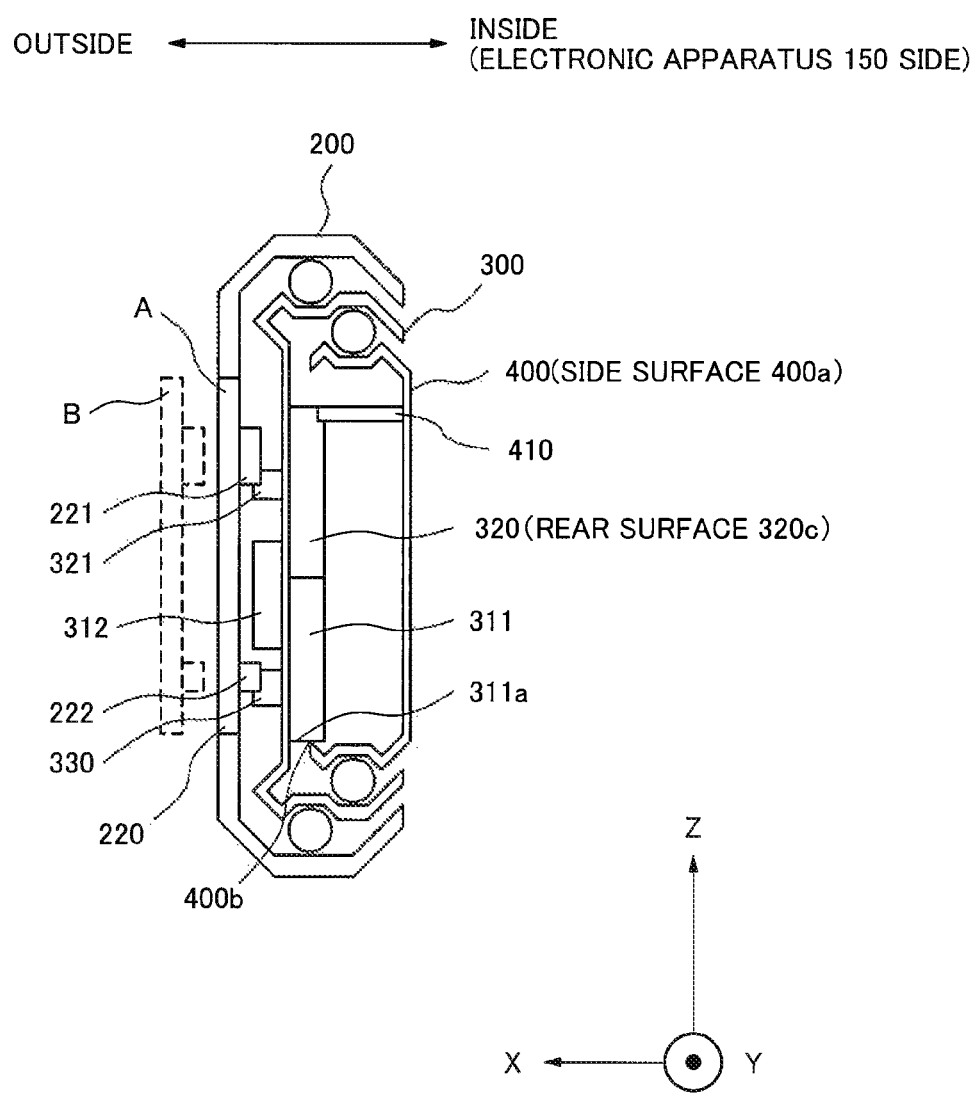
FIG. 3 is a rear side view of the rail set according to the first exemplary embodiment of the present invention in a state in which an inner rail is accommodated in a middle rail and the middle rail is accommodated in an outer rail.

FIG. 3 is a rear side view of the rail set 100b in a state in which the inner rail 400 is accommodated in the middle rail 300 and the middle rail 300 is accommodated in the outer rail 200. Respective components of the slide rail unit 100 will be described with reference to FIG. 2 and FIG. 3.

As illustrated in FIG. 3, the inner rail 400 holds the electronic apparatus 150 on a side surface 400a. The middle rail 300 includes a side surface which is opposed to the side surface 400a holding the electronic apparatus 150 of the inner rail 400 and which is in parallel to or substantially parallel to the side surface 400a. The middle rail 300 supports the inner rail 400, for example, such that the middle rail 300 covers the inner rail 400 from outside. The outer rail 200 includes a side surface which is in parallel to or substantially parallel to the above-mentioned side surface of the middle rail 300. The outer rail 200 supports the middle rail 300, for example, such that the outer rail 200 covers the middle rail 300 from outside.

As illustrated in FIG. 2 and FIG. 3, the inner rail 400 includes, in the rear side of the unillustrated cabinet (at an end portion in the Y direction) and on a reverse-side surface (a surface which is not in contact with the electronic apparatus 150) of the side surface 400a of the inner rail 400 on which the electronic apparatus 150 is held, a lock fitting (protrusion) 410 projecting toward the middle rail 300.

As illustrated in FIG. 2, the outer rail 200 includes, in the rear side of the unillustrated cabinet (at an end portion in the Y direction), a lock button 210, a lock releasing lever 211, and a lock mechanism 220. The lock mechanism 220 includes a release bar 221 and a lock fitting 222. The outer rail 200 further includes a release bar 230. The lock mechanism 220 is a mechanism which performs lock and lock release of the middle rail 300 (the details will be described below).

Figure 4:
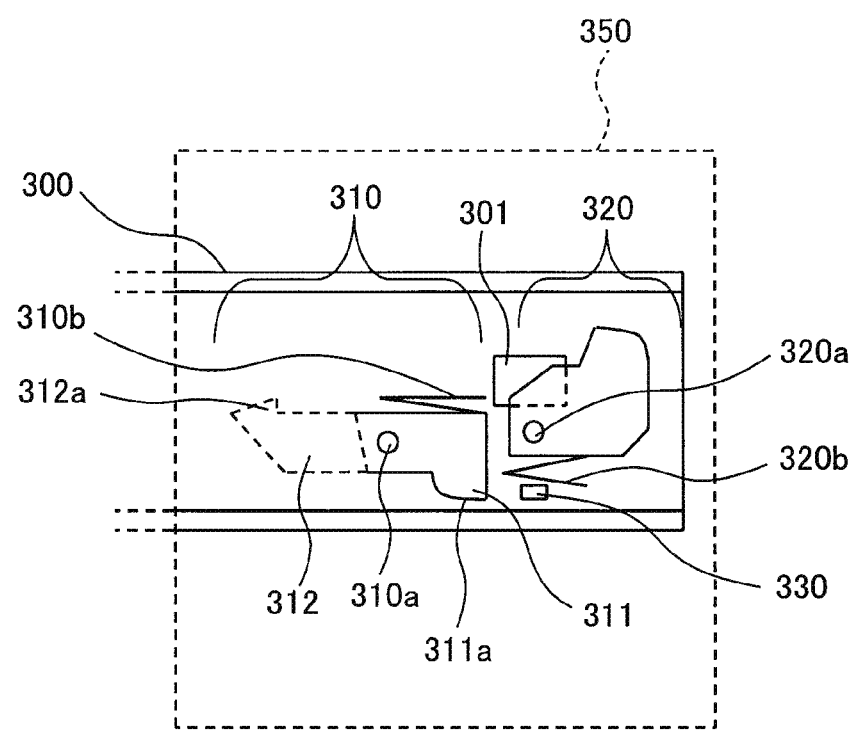
FIG. 4 is an enlarged view of a lock mechanism which is provided at the rear of the middle rail constituting the slide rail unit according to the first exemplary embodiment of the present invention.
Figure 5:
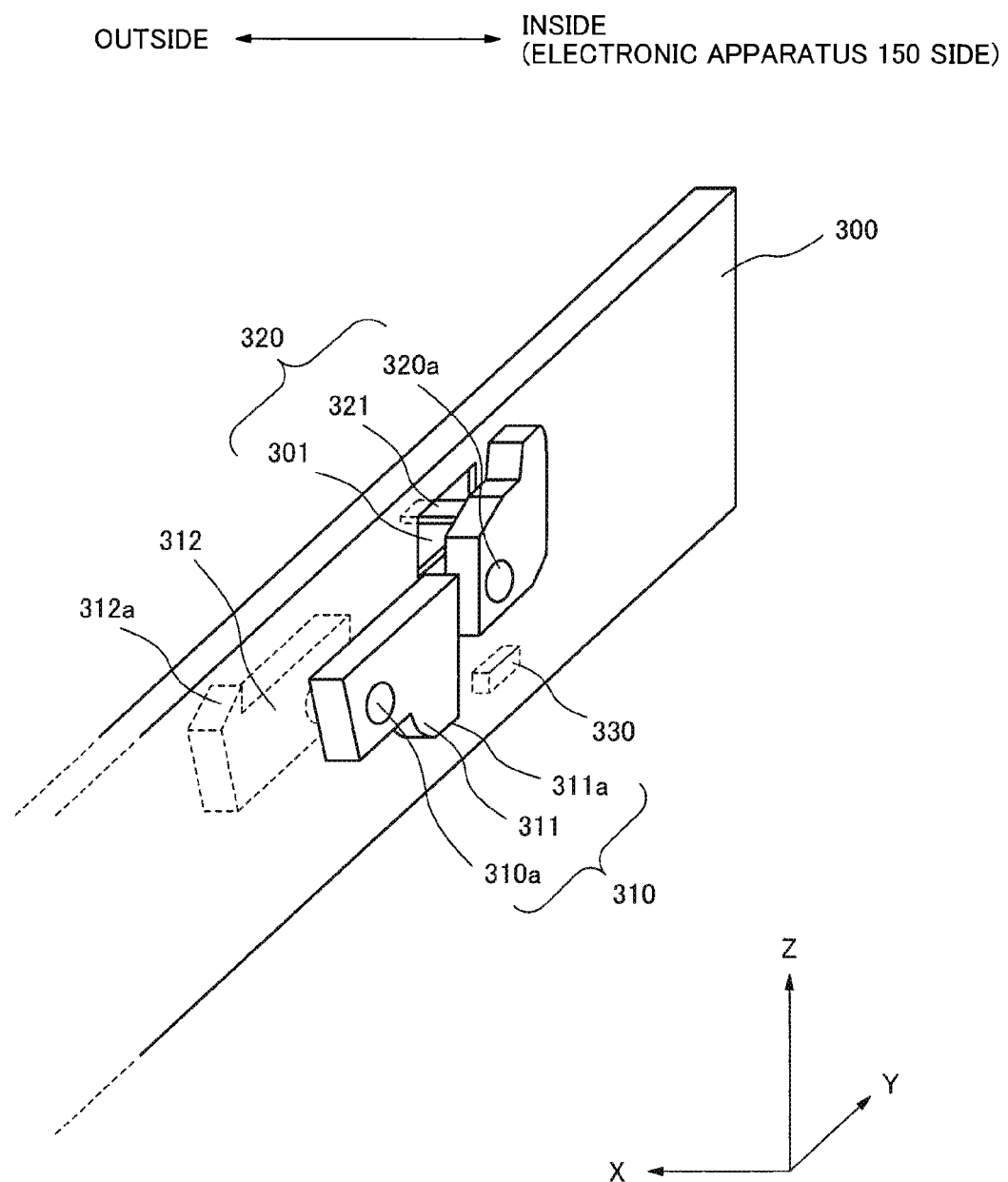
FIG. 5 is an enlarged perspective view of the lock mechanism which is provided at the rear of the middle rail constituting the slide rail unit according to the first exemplary embodiment of the present invention.

As illustrated in FIG. 2, the middle rail 300 includes, in the rear side of the unillustrated cabinet, a lock mechanism 350. The lock mechanism 350 is a mechanism which performs lock and lock release of the inner rail 400 and the middle rail 300 (the details will be described below). FIG. 4 is an enlarged drawing of the lock mechanism 350. As illustrated in FIG. 4, the lock mechanism 350 includes an inner rail lock mechanism (a second lock means) 320, a middle rail lock mechanism (a third lock means) 310, and a lock fitting (first lock means) 330. FIG. 5 is a perspective view of an inner rail lock mechanism 320, a middle rail lock mechanism 310, and a lock fitting 330 which the lock mechanism 350 includes. It is noted that FIG. 5 omits illustration of energizing springs 310b, 320b illustrated in FIG. 4 which will be described below.

As illustrated in FIG. 4 and FIG. 5, the inner rail lock mechanism 320 is arranged inside (on the electronic apparatus 150 side) the middle rail 300, and is rotatably fixed thereon by a rotation shaft 320*a* which penetrates the middle rail 300 in the X direction. The inner rail lock mechanism 320 includes a projection piece 321 projecting from the inside of the middle rail 300 to the outside of the middle rail 300 through a notch opening 301 provided on the middle rail 300.

The inner rail lock mechanism 320 stops at a position illustrated in FIG. 4 in a state in which the middle rail 300 accommodates the inner rail 400 therein. The inner rail lock mechanism 320 rotates around the rotation shaft 320*a* when a force in the Y direction is applied. When the applied force is removed, the inner rail lock mechanism 320 returns to its original position by a force of an energizing spring 320*b* in the Z-direction (the details will be described below).

As illustrated in FIG. 3 and FIG. 5, the middle rail lock mechanism 310 includes an inside lock member 311 and an outside lock member 312. The inside lock member 311 is arranged inside the middle rail 300. The outside lock member 312 is arranged outside the middle rail 300, specifically on a reverse side (back side) of a surface on which the inside lock member 311 is arranged. The inside lock member 311 and the outside lock member 312 are rotatably connected and fixed with each other through a rotation shaft 310*a* which penetrates the middle rail 300 in the X direction.

The above-mentioned lock fitting 222, 410, lock button 210, lock releasing lever 211, release bar 221, 230, inner rail lock mechanism 320, middle rail lock mechanism 310, and the like may be a fitting or the like, or may be made of a material different from that of the rails.

An overview of the operation of the middle rail lock mechanism 310 will now be described. When the inner rail 400 is accommodated inside the middle rail 300, the middle rail lock mechanism 310 stops at a position illustrated in FIG. 4. At this time, as illustrated in FIG. 3, a bottom side 311*a* of the inside lock member 311 of the middle rail lock mechanism 310 presses a bottom side 400*b* (a surface supported by the middle rail) of the inner rail 400 with a force of the energizing spring 310*b* illustrated in FIG. 4 in the downward (−Z) direction.

In the above state, when the rear end of the bottom side 400*b* passes the position of the bottom side 311*a* of the inside lock member 311 while the inner rail 400 slides forward, the middle rail lock mechanism 310 rotates around the rotation shaft 310*a* (the details will be described below).

Next, an overview of the lock mechanism 220 which the outer rail 200 includes will be described. The lock mechanism 220 is a base plate which is configured as a part of the side surface of the outer rail 200 and which is detachable from the outer rail 200.

In FIG. 3, the lock mechanism 220 at a position A (a first position: attached state) is shown in a solid line, and the lock mechanism 220 at a position B (a second position: detached state) is shown in a dashed line. The lock mechanism 220 can moves in the X direction and in the (−X) direction between the position A and position B. In the following, the state in which the lock mechanism 220 is at a position A is referred to as a "lock-activated state", and the state in which the lock mechanism 220 is at a position B is referred to as a "lock-deactivated state".

Figure 6:
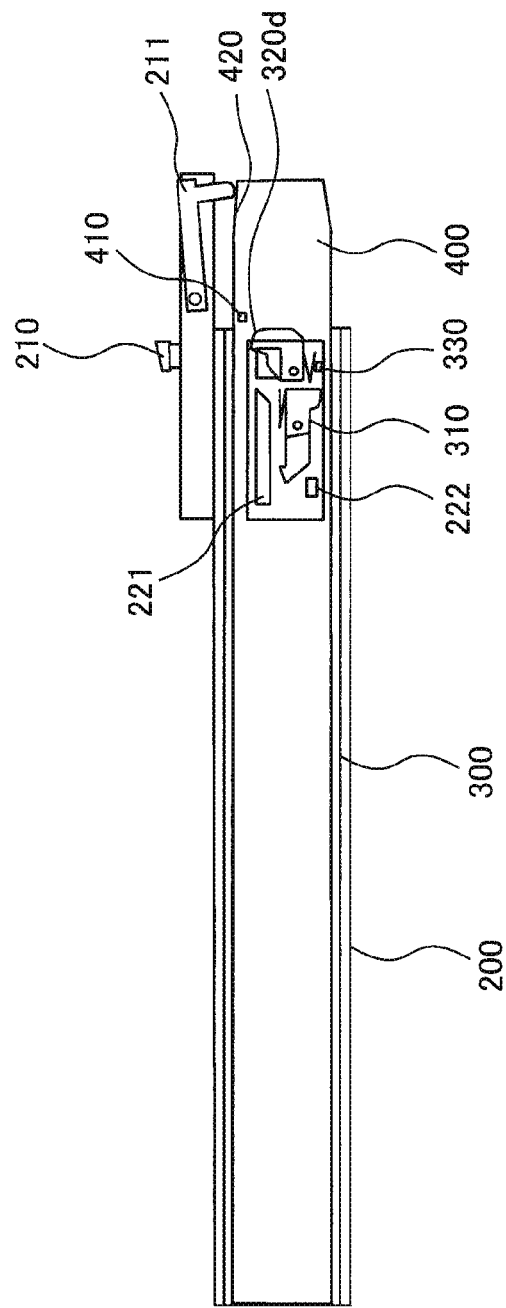
FIG. 6 is a side view of the slide rail unit according to the first exemplary embodiment of the present invention in a state in which the inner rail and the middle rail are accommodated in the outer rail.

FIG. 6 is a side view illustrating a state in which the inner rail 400 accommodated in the middle rail 300 illustrated in FIG. 2 is accommodated in the outer rail 200. In this side view, a component which each rail includes is expressed in a solid line regardless of its three-dimensional positional relation. As illustrated in FIG. 6, the middle rail 300 and the outer rail 200 have substantially the same length. The inner rail 400 has a longer depth (in the Y direction) than those of the middle rail 300 and the outer rail 200. When the electronic apparatus 150 is accommodated in the cabinet and is in a normal operation state, the slide rail unit 100 is in the state illustrated in FIG. 6. Hereinafter, a state in which each rail is accommodated as illustrated in FIG. 6 is referred to as the "closed state", and a position of each rail in the closed state is referred to as a "closed position".

In the closed state as illustrated in FIG. 6, the lock releasing lever 211 is pushed up by the inner rail 400. On the other hand, when the inner rail 400 slides forward and the inner rail 400 is not accommodated at the closed position, the lock releasing lever 211 is in parallel to or substantially in parallel to each rail as illustrated in FIG. 2. In other words, when, from a state as illustrated in FIG. 2, a user pushes the inner rail 400 into the outer rail 200, the inner rail 400 is pushed in to the rearmost thereof (to the closed position) while the inner rail 400 pushes up the lock releasing lever 211 without colliding with the lock releasing lever 211 due to a notch 420 provided at the rear end of the inner rail 400. The lock releasing lever 211 is pushed up at the position illustrated in FIG. 6, and at the same time is stopped.

<Operation of Slide Rail Unit 100 in Lock-Deactivated State>

The term "lock" in the above-mentioned "lock-deactivated state" or "lock-activated state" means that the middle rail 300 is locked by the outer rail 200. Accordingly, the lock-deactivated state is a state in which a lock between the middle rail 300 and the outer rail 200 is deactivated when a user draws out the electronic apparatus 150. At this time, the middle rail 300 can be drawn without being locked by the outer rail 200 at the closed position.

For example, a user may want to perform an operation of the electronic apparatus 150 such as coping with a failure thereof on the cabinet without removing the electronic apparatus 150 from the cabinet. In such cases, a user can perform an operation easily when the middle rail 300 is fully drawn out. In this case, a user sets the lock mechanism 220 to the position B (i.e., the lock-deactivated state) as illustrated in FIG. 3 (the details will be described below).

Figure 7:
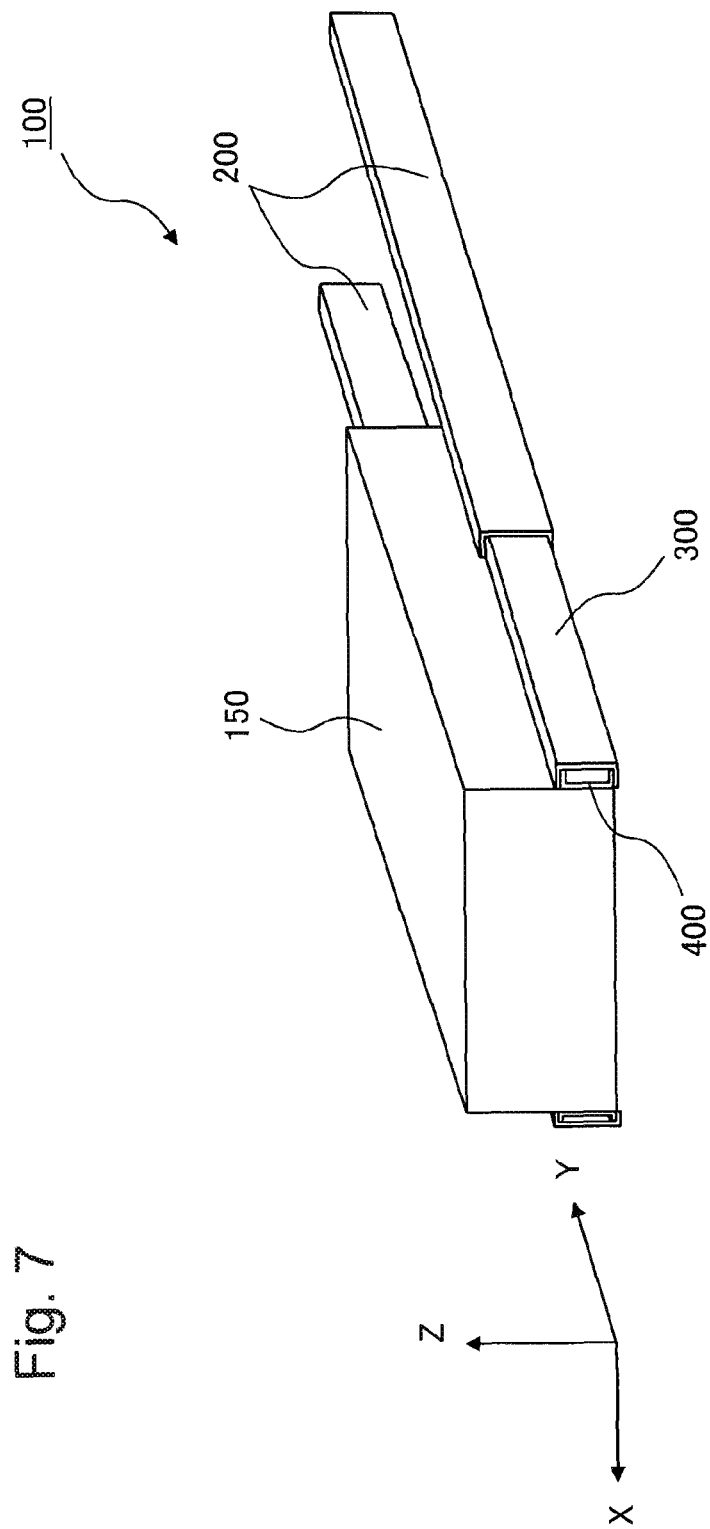
FIG. 7 is a perspective view of the slide rail unit according to the first exemplary embodiment of the present invention in a state in which the middle rail is drawn out to a release bar position while accommodating the inner rail.

When the lock mechanism 220 is in the lock-deactivated state and, from the closed state as illustrated in FIG. 6, a user draws out the electronic apparatus 150, the middle rail 300 is drawn out in a state in which the middle rail 300 is supported by the outer rail 200 while accommodating the inner rail 400. Then, the middle rail 300 stops at the position of a release bar 230 illustrated in FIG. 2 which is provided at about the middle of the outer rail 200 (the details will be described below). FIG. 7 is a drawing illustrating a state in which the middle rail 300 is drawn out to the position of the release bar 230 while accommodating the inner rail 400. At this position, a user conducts, for example, maintenance of the electronic apparatus 150 without removing the electronic apparatus 150 from the cabinet.

<Operation of Slide Rail Unit 100 in Lock-Activated State>

On the other hand, when a user wants to take out the electronic apparatus 150 from the cabinet, for example, at the time of removing the electronic apparatus 150, the user sets the lock mechanism 220 to the lock-activated state. A user pushes down a lock button 210 for setting the lock mechanism 220 to the lock-activated state. When the lock button 210 has been pushed down, the lock mechanism 220 moves from the position B to the position A as illustrated in FIG. 3.

The lock mechanism 220 is at the position B when each rail is in the above-mentioned closed state. The lock mechanism 220 moves from the position B to the position A in response to the lock button 210 being pushed down. Each rail is pushed in to the closed position in a state in which the lock mechanism 220 is at the position A, thereby a lock releasing lever 211 being pushed up, and in response thereto, the lock mechanism 220 moves to the position B.

The position A is a position where the release bar 221 provided on the lock mechanism 220 can be in contact with the projection piece 321 and the lock fitting 222 can be in contact with a lock fitting 330. The position B is a position where the lock mechanism 220 moves from the position A in the X direction such that the release bar 221 provided on the lock mechanism 220 is not in contact with the projection piece 321 and the lock fitting 222 is not in contact with the lock fitting 330.

Figure 8A:
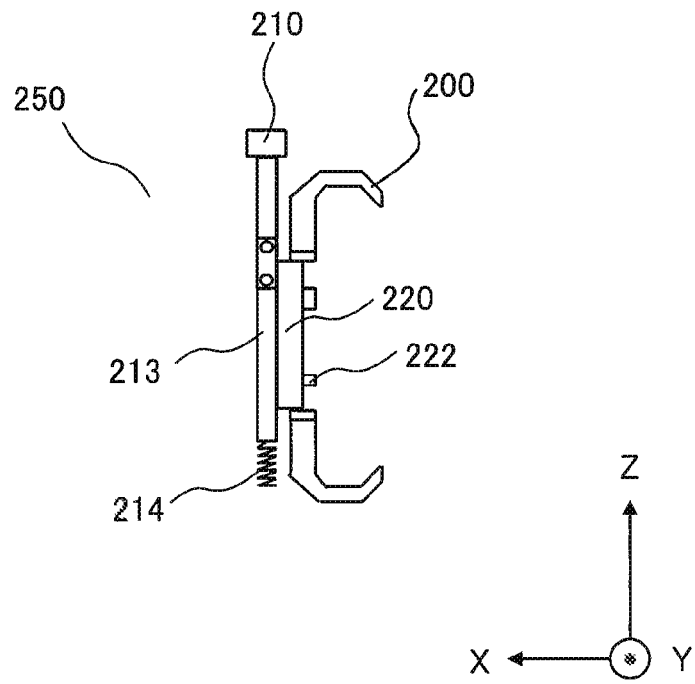
FIG. 8A is a rear side view of the outer rail when a lock adjustment mechanism which the slide rail unit according to the first exemplary embodiment of the present invention includes is in a lock-deactivated state.
Figure 8B:
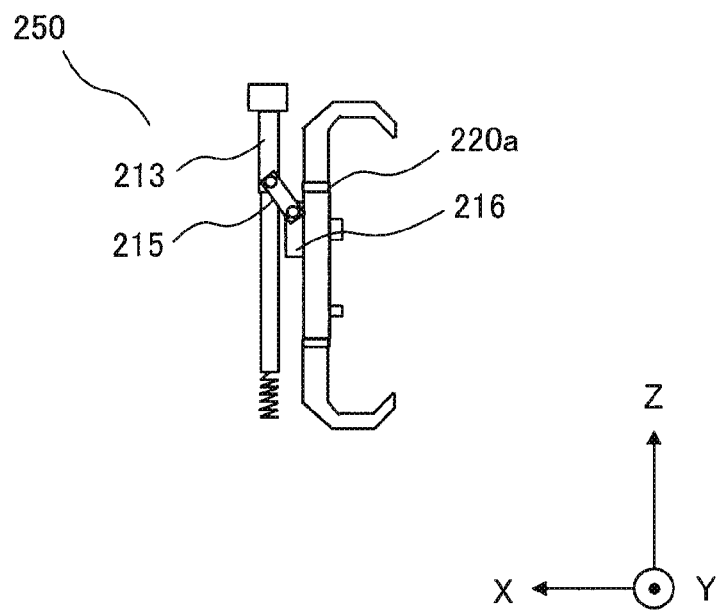
FIG. 8B is a rear side view of the outer rail when a lock adjustment mechanism which the slide rail unit according to the first exemplary embodiment of the present invention includes is in a lock-activated state.

A lock adjustment mechanism 250 which controls the operation of the lock mechanism 220 will now be described. FIG. 8A and FIG. 8B are rear side views of the outer rail 200 illustrating the configurations of the lock adjustment mechanism 250. FIG. 8A illustrates the lock mechanism 220 in the lock-deactivated state, and FIG. 8B illustrates the lock mechanism 220 in the lock-activated state. FIG. 9A is a side view of the lock adjustment mechanism 250 illustrated in FIG. 8A, and FIG. 9B is a top view of the lock adjustment mechanism 250 illustrated in FIG. 9A. As illustrated in FIG. 8A and FIG. 9A, the above-mentioned lock button 210 and lock releasing lever 211 are included in the lock adjustment mechanism 250.

As illustrated in FIG. 8A and FIG. 9A, the lock button 210 is supported by a supporting bar 213, and a spring 214 is provided at the bottom of the supporting bar 213. As illustrated in FIG. 8B, the supporting bar 213 is provided with a movable portion 215 and a connector 216. The connector 216 is connected to the lock mechanism 220. The movable portion 215 is connected to the supporting bar 213 and the connector 216 each by a rotatable rotation shaft.

When the lock button 210 is pushed down, the movable portion 215 rotates around the rotation shaft as illustrated in FIG. 8B, and the connector 216 moves in the (−X) direction by the rotation. When the connector 216 moves in the (−X) direction, the lock mechanism 220 moves in the (−X) direction along a guide 220a to be fitted to the outer rail 200. In the configuration mentioned above, the lock mechanism 220 becomes in the lock-activated state in response to the lock button 210 being pushed down.

The pushed down lock button 210 stops at a position illustrated in FIG. 8B because of the following configuration. Specifically, as illustrated in FIG. 9B, the supporting bar 213 of the lock button 210 is provided with a protrusion 213a projecting toward the outer rail 200. The outer rail 200 is provided with fittings 217, 218 which are movable along a guide (not illustrated).

When the lock button 210 is not pushed down, a fitting 218 is in a state in which a protrusion 218a provided at the front is pressed against the protrusion 213a provided on the supporting bar 213. When the lock button 210 is pushed down, the protrusion 218a of the fitting 218 is not in contact with the protrusion 213a, whereby the fitting 218 is pushed out in the front (in the (−Y) direction). As the result, the protrusion 213a comes in contact with the protrusion 218a of the fitting 218, and thus, the lock button 210 stops in a state of being pushed down without returning to the original position. In the configuration mentioned above, the lock mechanism 220 becomes in the lock-activated state in response to the lock button 210 being pushed down.

The operation of each rail in the lock-activated state will now be described. When, in the lock-activated state, a user draws out the electronic apparatus 150, the inner rail 400 on which the electronic apparatus 150 is fixed is drawn out, and the lock releasing lever 211 illustrated in FIG. 6 moves down to the position as illustrated in FIG. 2. When the inner rail 400 is further drawn out, a lock fitting 410 provided on the inner rail 400 comes in contact with a rear side surface (320c illustrated in FIG. 3) in the Y direction of the inner rail lock mechanism 320. By this contact, the middle rail 300 is drawn out interlocked with the inner rail 400 (being pushed by the inner rail 400).

Figure 10:
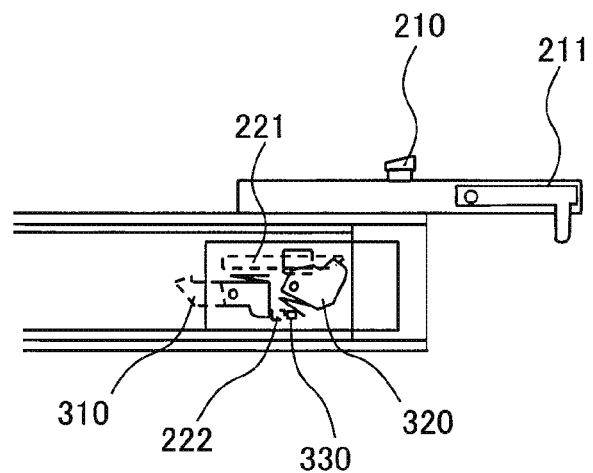
FIG. 10 is a drawing illustrating a state in which an inner rail lock mechanism in the slide rail unit according to the first exemplary embodiment of the present invention is rotated around a rotation shaft.

As mentioned above, when the middle rail 300 is drawn out, for example, by about 1 cm (centimeter), a projection piece 321 of the inner rail lock mechanism 320 provided on the middle rail 300 as illustrated in FIG. 5 comes in contact with the release bar 221. Thereafter, when the middle rail 300 is further drawn out, the projection piece 321 of the inner rail lock mechanism 320 is subjected to a force in the Y direction by the release bar 221 to rotates the inner rail lock mechanism 320 around the rotation shaft 320a. FIG. 10 is a drawing illustrating the operation of the inner rail lock mechanism 320 rotating around the rotation shaft 320a.

The inner rail lock mechanism 320 includes a notch (320d illustrated in FIG. 6) at the back side in the Y direction on the upper face thereof. By this notch, the inner rail lock mechanism 320 does not collide with the lock fitting 410 due to the above-mentioned rotation, and the contact (lock) with the lock fitting 410 is released. At this time, as illustrated in FIG. 10, since the lock fitting 330 provided on the middle rail 300 is in contact with the lock fitting 222 provided on the lock mechanism 220, the middle rail 300 is locked to the outer rail 200 and is prevented from being further drawn out forward (in the −Y direction). Accordingly, when the inner rail 400 is further drawn out, the middle rail 300 is not interlocked therewith and stopped at the position where the lock fitting 330 is in contact with the lock fitting 222, and thus, only the inner rail 400 is drawn out.

Figure 11:
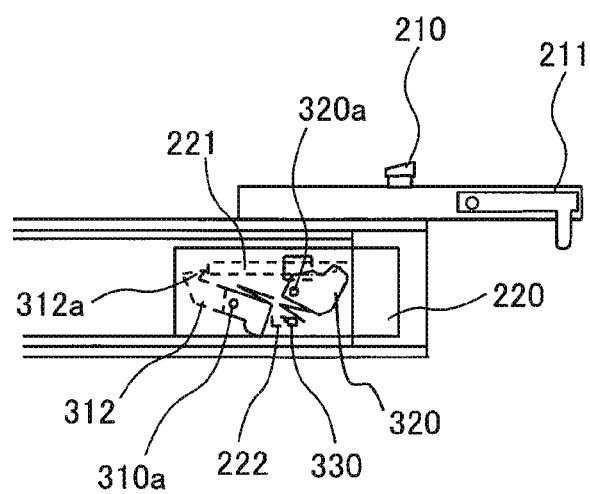
FIG. 11 is a drawing illustrating a state in which a middle rail lock mechanism and the inner rail lock mechanism in the slide rail unit according to the first exemplary embodiment of the present invention are rotated around individual rotation shafts.

Subsequently, when the inner rail 400 is still further drawn out and the rear end of the bottom side 400b passes the position of the middle rail lock mechanism 310, the middle rail lock mechanism 310 operates in the following manner. As mentioned above, the bottom side 311a of the inside lock member 311 is in contact with the bottom side 400b of the inner rail 400. Therefore, when the rear end of the inner rail 400 passes the position of the bottom side 311a of the inside lock member 311, pressure on the bottom side 400b of the inner rail 400 by the bottom side 311a of the inside lock member 311 is released. By this, the middle rail lock mechanism 310 rotates around the rotation shaft 310a in response to a force in the (−Z) direction by the energizing spring 310b. FIG. 11 is a drawing illustrating a state in which the middle rail lock mechanism 310 rotates around the rotation shaft 310a.

When the middle rail lock mechanism 310 rotates around the rotation shaft 310a, the protrusion portion 312a provided on the outside lock member 312 is engaged with the release bar 221 as illustrated in FIG. 11. This prevents the middle rail 300 from moving backward (in the Y direction).

By the above-mentioned configuration, the middle rail 300 is locked to the outer rail 200 and prevented from sliding forward and backward (in the Y direction and in the (−Y) direction) due to the rotation of the middle rail lock mechanism 310 and the contact between the lock fitting 330 and the lock fitting 222. By this, a user can draw out only the inner rail 400 fixing the electronic apparatus 150. At this time, since the middle rail 300 is locked to the outer rail 200, only a space required for drawing out the inner rail 400 is required in front of the cabinet. In this state, a user removes the electronic apparatus 150 and conducts replacement or the like.

The operation of the slide rail unit 100 will now be described in cases in which a user has removed the electronic apparatus 150 and conducted replacement as mentioned above and then an electronic apparatus 150 is accommodated in the cabinet again.

<Operation of Slide Rail Unit 100 in Cases in which Electronic Apparatus 150 is Once Removed and Accommodated Again>

When a user accommodates the electronic apparatus 150 in the cabinet again, the user slides the inner rail 400 on which the electronic apparatus 150 is fixed in the (−Y) direction in a state in which the inner rail 400 is supported by the outer rail 200. When the inner rail 400 is accommodated to the closed position, the lock releasing lever 211 is pushed up by the notch 420 provided on the inner rail 400 to return to the position illustrated in FIG. 6 from the position illustrated in FIG. 11.

At this time, as the lock releasing lever 211 is pushed up by the inner rail 400, the lock mechanism 220 provided on the outer rail 200 moves from the position A to the position B as illustrated in FIG. 3. At the position B, the lock mechanism 220 is in the lock-deactivated state.

The lock mechanism 220 becomes in the lock-deactivated state when the lock releasing lever 211 is pushed up, which is due to the following configuration. As illustrated in FIG. 9B, a fitting 217 is connected to the lock releasing lever 211, and moves backward (in the Y direction) as the lock releasing lever 211 is pushed up. It is note that one end of the fitting 219 is fixed on the fitting 217. The other end of the fitting 219 moves along a groove 219a of a guide.

When the lock releasing lever 211 is pushed up, the fitting 217 moves backward. Accordingly, a protrusion 218b of the fitting 218 is overlapped with the groove 219a of the guide, whereby the protrusion 218b of the fitting 218 is pushed backward. This eliminates the contact between a forward protrusion of the fitting 218 and the protrusion 213a provided on the supporting bar 213 of the lock button 210, and thus, the lock button 210 is pushed up by the spring 214. This allows the lock mechanism 220 to be in the lock-deactivated state.

<Operation of Slide Rail Unit 100 in Cases in which Inner Rail 400 is Accommodated to Closed Position and then Inner Rail 400 is Drawn Out>

In cases in which a user draws out the inner rail 400 again after the lock mechanism 220 has become the lock-deactivated state, the lock mechanism 220 which the outer rail 200 includes does not lock the middle rail 300. In other words, the middle rail 300 is drawn out interlocked with the inner rail 400. The middle rail 300 then moves together with the inner rail 400 to the position of the release bar 230.

The inner rail lock mechanism 320 and the middle rail lock mechanism 310 function with respect to the release bar 230 in a similar manner to the above-mentioned function with respect to the release bar 221. Specifically, when the middle rail 300 is drawn out to the position of the release bar 230, the inner rail lock mechanism 320 is subjected to a force in the Y direction from the release bar 230 to rotate around the rotation shaft 320a. This releases the lock between the middle rail 300 and the inner rail 400, and only the inner rail 400 is further drawn out. At this time, a user can work on the electronic apparatus 150 with each rail fully drawn out.

In this manner, the lock adjustment mechanism 250 makes the lock mechanism 220 in the lock-deactivated state when the inner rail 400 is accommodated to the closed position, and thus the middle rail 300 is not locked by the outer rail 200. Therefore, a user can draw out an electronic apparatus 150 without any special operation when the user want to work on the electronic apparatus 150 by drawing out not by removing.

As mentioned above, according to the first exemplary embodiment, the middle rail 300 includes the middle rail lock mechanism 310, the inner rail lock mechanism 320, and the lock mechanism 350 comprising the lock fitting 330. The outer rail 200 includes a detachable lock mechanism 220 comprising the release bar 221 and the lock fitting 222.

According to the first exemplary embodiment, the inner rail 400 can be drawn out in a state in which the lock mechanism 220 of the outer rail 200 locks the middle rail 300 by employing the above-mentioned configuration, thereby obtaining an effect of reducing a workspace required when the electronic apparatus 150 is taken out from the slide rail unit 100. Since a user does not need to lift up the electronic apparatus 150 when removing the electronic apparatus 150, an effect of reducing the burden of the user can also be obtained.

The outer rail 200 includes the lock adjustment mechanism 250 including the lock button 210 allowing the lock mechanism 220 to be in the lock-activated state when being pushed down, and the lock releasing lever 211 allowing the lock mechanism 220 to be in the lock-deactivated state when being pushed up. According to the first exemplary embodiment, the lock mechanism 220 is in the lock-deactivated state by the lock adjustment mechanism 250 when the inner rail 400 is accommodated to the closed position. Therefore, an effect can be obtained that a user can draw out an electronic apparatus 150 without any special operation when the user want to work on the electronic apparatus 150 by drawing out not by removing.

The first exemplary embodiment indicates that rail set 100b illustrated in FIG. 1 includes components related to locking of the middle rail 300 such as the above-mentioned lock mechanism 220, 350, and lock fitting 410, although rail set 100a may include such components.

Second Exemplary Embodiment

Next, a second exemplary embodiment based on the above-described first exemplary embodiment will be described. In the description below, the same reference number is assigned to the same configuration as the first exemplary embodiment, and the duplicated description will be omitted.

The above-mentioned exemplary embodiment describes a configuration in which the lock mechanism 220 which the outer rail 200 includes is deactivated when the electronic apparatus 150 is in a normal operation state, and the lock mechanism 220 becomes activated when the lock button 210 is pushed down. The second exemplary embodiment will describe a configuration in which the lock mechanism 220 is activated when the electronic apparatus 150 in in a normal operation state, and the lock mechanism 220 becomes deactivated when the lock button 210 is pushed down.

In a data center or the like, when an electronic apparatus is broken or the like, the electronic apparatus is removed from the cabinet and repairs are performed in another place, and then a new electronic apparatus is accommodated in the cabinet to resume operation in many cases. Under such circumstances, being activated the lock mechanism 220 in a normal operation state is advantageous. In other words, when the outer rail 200 and the middle rail 300 are locked and at the same time, the inner rail 400 can be removed without pushing down the lock button 210, the operation of pushing down the lock button 210 is not necessary, thereby saving handling time, which is advantageous.

Figure 12:
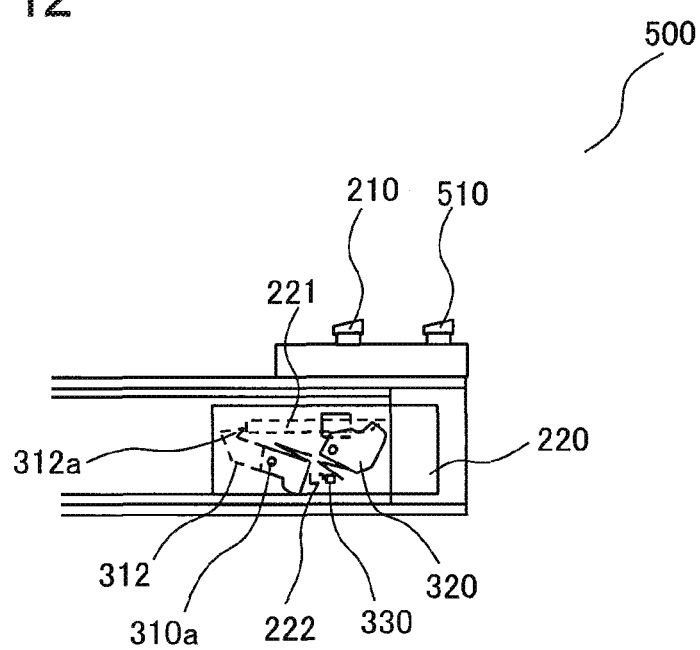
FIG. 12 is a drawing illustrating the structure of a slide rail unit according to a second exemplary embodiment of the present invention.

FIG. 12 is a drawing illustrating the configuration of a slide rail mechanism 500 according to the second exemplary embodiment of the present invention. FIG. 12 illustrates a state corresponding to FIG. 11 described in the above-mentioned first exemplary embodiment. In FIG. 12, the same reference number is assigned to the same configuration as FIG. 11, and the duplicated description will be omitted.

The slide rail mechanism 500 includes a release button 510 in place of the lock releasing lever 211 described in the first exemplary embodiment. The release button 510 makes, in response to being pushed down, the lock mechanism 220 be in the "lock-deactivated state" as described in the first exemplary embodiment.

In the first exemplary embodiment, the lock mechanism 220 is deactivated in a normal operation state, and becomes activated when the lock button 210 is pushed down. Further, when the inner rail 400 is pushed in again to the closed position after it has been drawn out, the lock mechanism 220 is deactivated without any special operation. On the other hand, in the second exemplary embodiment, the lock mechanism 220 is activated in a normal operation state, and becomes deactivated when the release button 510 is pushed down. Even when the inner rail 400 is pushed in again to the closed position after it has been drawn out, the lock mechanism 220 is still activated.

The slide rail mechanism 500 may have a configuration in which the release button 510 is not included, the lock mechanism 220 becomes activated when the lock button 210 is pushed down, and the lock mechanism 220 becomes deactivated when the lock button 210 is further pushed down.

As mentioned above, according to the second exemplary embodiment, the slide rail mechanism 500 includes the release button 510 which makes the lock mechanism 220 be deactivate, in which the lock mechanism 220 is activated in a normal operation state, and the lock mechanism 220 becomes deactivated when the release button 510 is pushed down. According to the second exemplary embodiment, the above-mentioned configuration makes it possible to remove the inner rail 400 without the operation of pushing down the lock button 210. This saves handling time of a user in a data center or the like where, in many cases, the middle rail 300 is locked to the outer rail 200 and only the inner rail 400 is to be taken out from the cabinet.

Third Exemplary Embodiment

Figure 13:
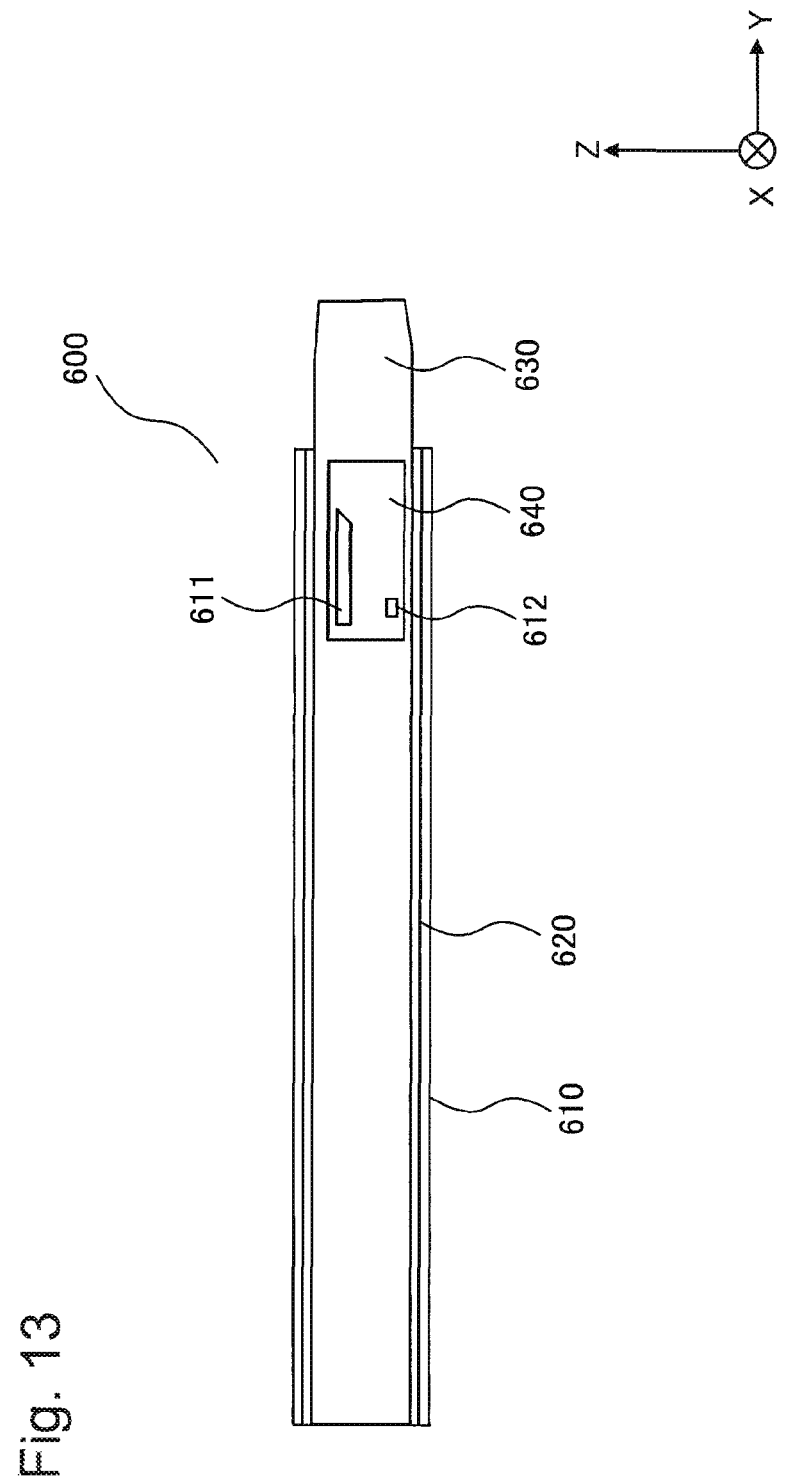
FIG. 13 is a drawing illustrating the structure of a slide rail unit according to a third exemplary embodiment of the present invention.
Figure 14:
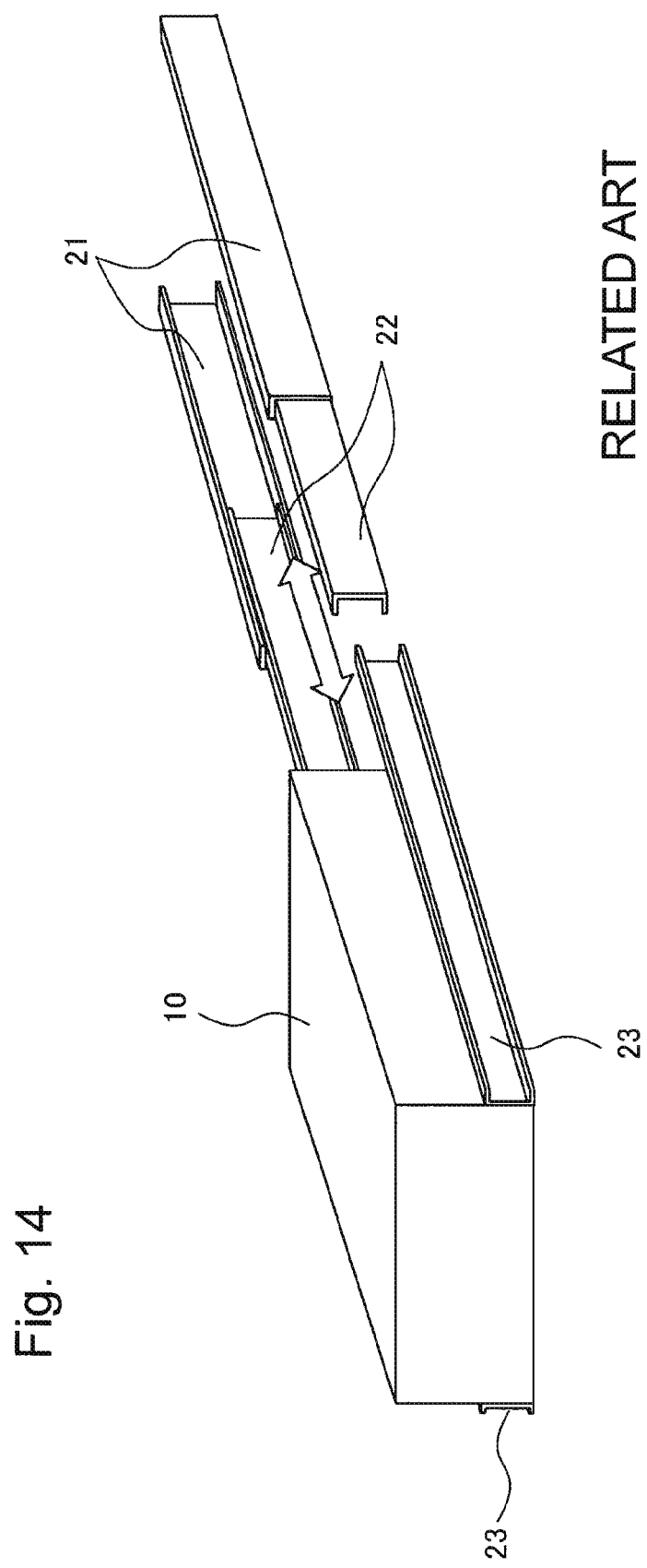
FIG. 14 is a drawing of a related art illustrating a state in which an electronic apparatus which has been drawn out is removed together with an inner rail.
Figure 15:
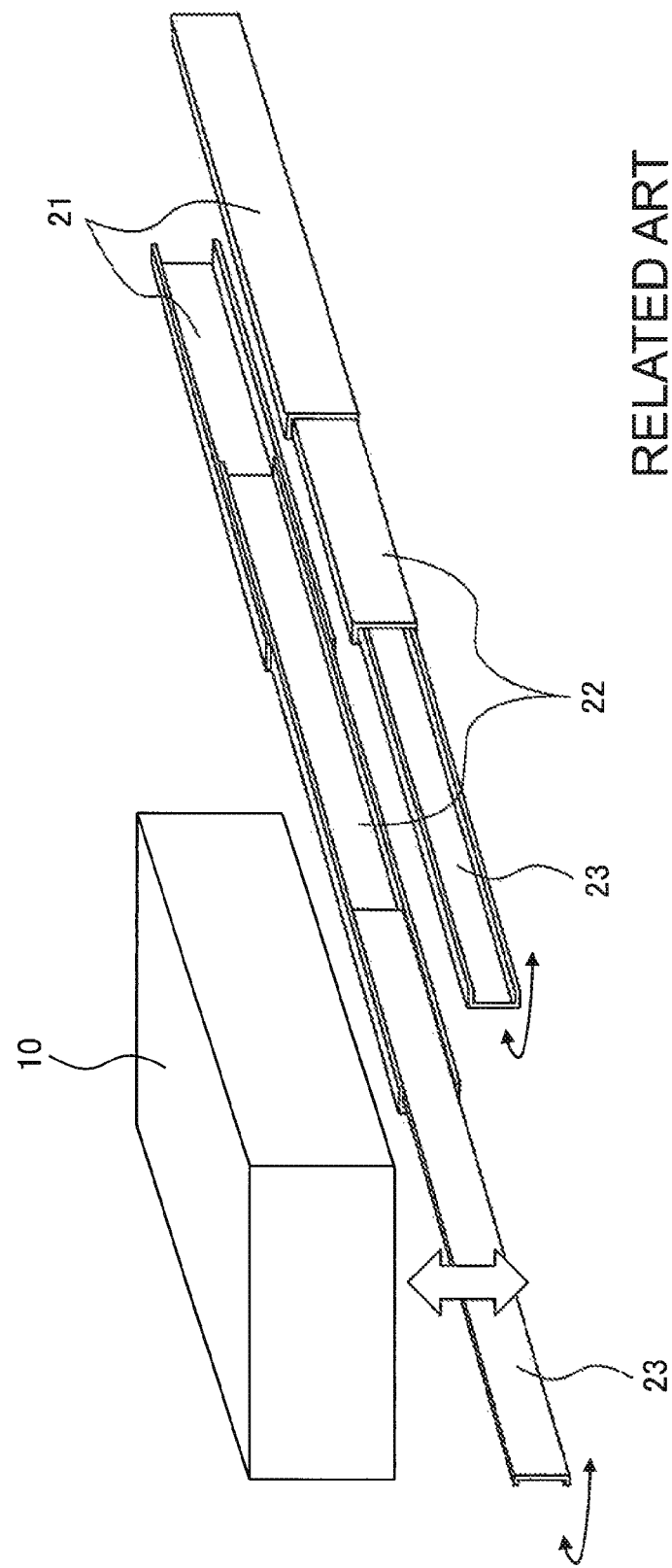
FIG. 15 is a drawing of another related art illustrating a state in which an electronic apparatus which has been drawn out is removed from an inner rail by lifting up.

FIG. 13 is a drawing illustrating the structure of a slide rail unit 600 according to a third exemplary embodiment of the present invention. As illustrated in FIG. 13, the slide rail unit 600 includes: an outer rail 610 attachable to a rack; a middle rail 620 slidably supported by the outer rail 610 along an extending direction of the outer rail 610; an inner rail 630 slidably supported by the middle rail 620 along an extending direction of the middle rail 620.

The slide rail unit 600 includes a lock mechanism 640 including: a release member 611 which releases a press against the middle rail 620 by the inner rail 630 when the inner rail 630 slides in one direction (in the −Y direction, forward direction) along the extending direction of the middle rail; and a suppression member 612 which prevents the middle rail 620 from sliding in the above-mentioned one direction.

The release member 611 corresponds to the release bar 221 in the above-mentioned first exemplary embodiment, and the suppression member 612 corresponds to the lock fitting 222 in the above-mentioned first exemplary embodiment.

According to the third exemplary embodiment, by employing the above configuration, a press against the middle rail 620 by the inner rail 630 is released by the release member 611, and the suppression member 612 prevents the middle rail 620 from sliding in the above-mentioned one direction, thereby obtaining an effect that a workspace required for taking out an object from the slide rail unit can be reduced when the object is mounted on a rack by using the slide rail unit.

INDUSTRIAL APPLICABILITY

The present invention is applicable, for example, to a cabinet in which an electronic apparatus is installed by using a three-member slide rail unit.

The previous description of embodiments is provided to enable a person skilled in the art to make and use the present invention. Moreover, various modifications to these exemplary embodiments will be readily apparent to those skilled in the art, and the generic principles and specific examples defined herein may be applied to other embodiments without the use of inventive faculty. Therefore, the present invention is not intended to be limited to the exemplary embodiments described herein but is to be accorded the widest scope as defined by the limitations of the claims and equivalents. Further, it is noted that the inventor's intent is to retain all equivalents of the claimed invention even if the claims are amended during prosecution.

REFERENCE SIGNS LIST 100, 600 slide rail unit
150 electronic apparatus
200, 610 outer rail
210 lock button
211 lock releasing lever
220, 350 lock mechanism
221, 230 release bar
222, 330 lock fitting
300, 620 middle rail
301 notch opening
310 middle rail lock mechanism
310a, 320a rotation shaft
310b, 320b energizing spring
311 inside lock member
312 outside lock member
320 inner rail lock mechanism
321 projection piece
400, 630 inner rail
420 notch

The invention claimed is:

1. A slide rail unit comprising:
an outer rail attachable to a rack;
a middle rail slidably supported by the outer rail along an extending direction of the outer rail, the middle rail comprising a first lock means and a second lock means; and
an inner rail slidably supported by the middle rail along an extending direction of the middle rail, the inner rail configured to hold an object, the inner rail comprising:
a protrusion projecting towards the middle rail on a reverse side of a surface on which the object is held;
a lock mechanism including:
a release member which releases the inner rail from pressing against the middle rail when the inner rail slides in one direction along the extending direction of the middle rail; and
a suppression member which prevents the middle rail from sliding in the one direction, the first lock means pressing the suppression member when the inner rail slides in the one direction,
wherein the second lock means is pressed on the protrusion when the inner rail slides in the one direction.

2. The slide rail unit according to claim 1, wherein the second lock means comprises a projection piece projecting from a notch opening provided on the middle rail to the outer rail side, and the release member included in the lock mechanism presses the projection piece when the inner rail slides in the one direction to rotate the second lock means around a first shaft which penetrates the middle rail, thereby releasing a press against the second lock means by the protrusion of the inner rail.

3. The slide rail unit according to claim 2, further comprising a lock adjustment mechanism which adjusts a movement from a first position where the release member and the suppression member are capable of being in contact with the projection piece and the first lock means respectively in response to a predetermined operation to a second position where the release member and the suppression member are not in contact with the projection piece and the first lock means respectively.

4. The slide rail unit according to claim 3, wherein the lock adjustment mechanism adjusts the release member and the suppression member to move from the second position to the first position when the inner rail is accommodated to a predetermined position.

5. The slide rail unit according to claim 4, wherein the lock mechanism is a base plate on which the release member and the suppression member are provided, wherein the base plate is configured to be a part of a surface in parallel to or substantially in parallel to a surface of the inner rail on which the object is held and is detachable to the outer rail.

6. A slide rail unit comprising:
an outer rail attachable to a rack;
a middle rail slidably supported by the outer rail along an extending direction of the outer rail, the middle rail comprising a lock means; and
an inner rail slidably supported by the middle rail along an extending direction of the middle rail, the inner rail comprising:
a lock mechanism including:
a release member which releases the inner rail from pressing against the middle rail when the inner rail slides in one direction along the extending direction of the middle rail; and
a suppression member which prevents the middle rail from sliding in the one direction,
wherein the lock means engages with the release member included in the lock mechanism when the inner rail slide in the one direction to pass the position of the lock means, and the engagement prevents the middle rail from sliding the other direction,
and wherein the lock means comprises:
an inside lock member which presses a surface of the inner rail supported by the middle rail and which is provided on a surface of the middle rail in parallel to or substantially parallel to a surface of the inner rail on which the object is held on the side of the object; and
an outside lock member which is rotatably connected with the inside lock member through a second shaft which penetrates the middle rail and which is provided on a reverse side of a surface on which the inside lock member of the middle rail is provided, the inside lock member releases a press against a surface of the inner rail supported by the middle rail when the inner rail slides in one direction to pass the position of the inside lock member, and at the same time the inside lock member rotates by the second shaft, and the outside lock member rotates by the rotation to engage with the release member included in the lock mechanism.

7. A rack comprising a slide rail unit, wherein the slide rail unit comprises:
an outer rail attachable to a rack;
a middle rail slidably supported by the outer rail along an extending direction of the outer rail, the middle rail comprising a first lock means and a second lock means; and
an inner rail slidably supported by the middle rail along an extending direction of the middle rail, the inner rail configured to hold an object, the inner rail comprising:
a protrusion projecting towards the middle rail on a reverse side of a surface on which the object is held;
a lock mechanism including:
a release member which releases the inner rail from pressing against the middle rail when the inner rail slides in one direction along the extending direction of the middle rail; and
a suppression member which prevents the middle rail from sliding in the one direction, the first lock means pressing the suppression member when the inner rail slides in the one direction,
wherein the second lock means is pressed on the protrusion when the inner rail slides in the one direction.

* * * * *